(12) United States Patent
Zafiropoulos et al.

(10) Patent No.: US 8,945,677 B2
(45) Date of Patent: Feb. 3, 2015

(54) ELECTRONIC DEVICE MANUFACTURE USING LOW-K DIELECTRIC MATERIALS

(75) Inventors: Nicholas A. Zafiropoulos, Newton, MA (US); Paul Nahass, Cambridge, MA (US); Roxana Trifu, Worcester, MA (US); Redouane Begag, Hudson, MA (US); Wendell E. Rhine, Belmont, MA (US); Wenting Dong, Marlborough, MA (US); Shannon White, Hudson, MA (US); George L. Gould, Mendon, MA (US); Alaric Naiman, Lincoln, MA (US); Roger Sinta, Woburn, MA (US)

(73) Assignee: Aspen Aerogels, Inc., Northborough, MA (US)

( * ) Notice: Subject to any disclaimer, the term of this patent is extended or adjusted under 35 U.S.C. 154(b) by 157 days.

(21) Appl. No.: 13/358,462

(22) Filed: Jan. 25, 2012

(65) Prior Publication Data
US 2012/0189782 A1     Jul. 26, 2012

Related U.S. Application Data

(60) Provisional application No. 61/435,840, filed on Jan. 25, 2011.

(51) Int. Cl.
*B05D 3/10*     (2006.01)
*H01L 21/02*     (2006.01)
*H01L 21/3105*     (2006.01)
*C08L 79/08*     (2006.01)

(52) U.S. Cl.
CPC .... *H01L 21/02126* (2013.01); *H01L 21/02118* (2013.01); *H01L 21/02203* (2013.01); *H01L 21/02282* (2013.01); *H01L 21/31058* (2013.01); *C08L 79/08* (2013.01)
USPC ......... 427/340; 427/337; 427/341; 427/407.1

(58) Field of Classification Search
None
See application file for complete search history.

(56) References Cited

U.S. PATENT DOCUMENTS

2004/0087670 A1*   5/2004   Lee et al. .......................... 516/99
2004/0110014 A1*   6/2004   Chen et al. .................... 428/447
2004/0132845 A1*   7/2004   Rhine et al. ..................... 521/82

FOREIGN PATENT DOCUMENTS

EP            0144661       *   3/1992          H01L 21/312

* cited by examiner

*Primary Examiner* — Erma Cameron
(74) *Attorney, Agent, or Firm* — Mark Hanson; Poongunran Muthukumaran

(57) ABSTRACT

Materials and methods for manufacturing electronic devices and semiconductor components using low dielectric materials comprising polyimide based aerogels are described. Additional methods for manipulating the properties of the dielectric materials and affecting the overall dielectric property of the system are also provided.

18 Claims, 7 Drawing Sheets

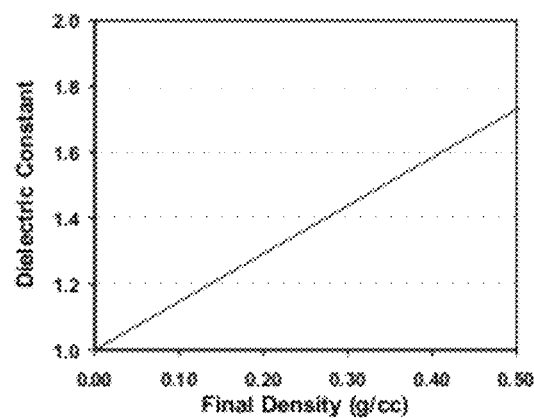
Figure 2. Polyimide aerogels dielectric constant vs. density

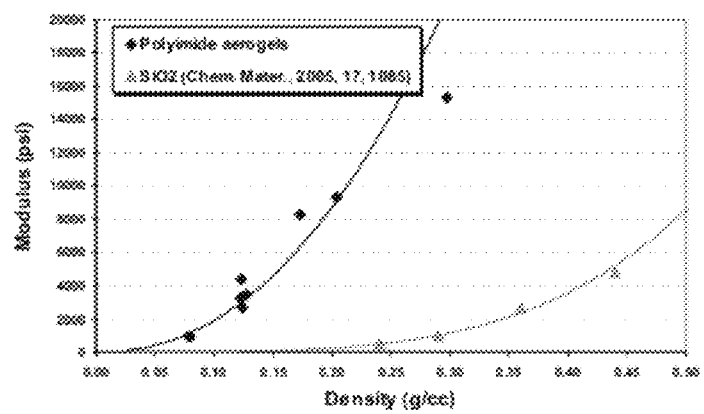
Figure 3. Compression modulus versus density for polyimide and silica monolithic aerogels

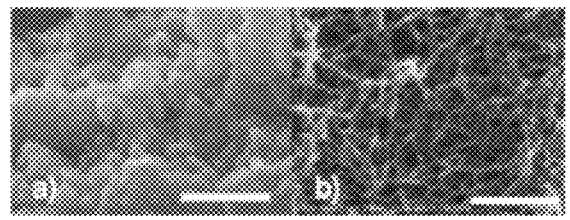
Figure 4. Scanning electron microscope images of silica aerogel (a) and polyimide aerogel (b). Scale bar represents 200 nm

ELECTRONIC DEVICE MANUFACTURE USING LOW-K DIELECTRIC MATERIALS

This Application claims the benefit of U.S. Provisional Patent Application Ser. No. 61/435,840, filed on Jan. 25, 2011 under 35 U.S.C. §119(e), which application is incorporated by reference herein in its entirety.

FIELD OF THE INVENTION

The present disclosure relates generally to the field of manufacture of electronic devices. In particular, the present invention relates to the manufacture of integrated circuits containing low dielectric constant material.

BACKGROUND

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, known as RC delay, and also to increase the speed of signal propagation in these components. One method of accomplishing these goals is to reduce the dielectric constant of the interlayer insulating material used in the components that separate the signal carrier species. A method for reducing the dielectric constant of such interlayer insulating material is to incorporate within the insulating film very small, uniformly dispersed pores or voids. Since air and other gasses have the lowest dielectric constants, their incorporation significantly lowers the overall dielectric constant. Most materials are limited in the amount of air pockets they can contain and still maintain structural integrity.

A variety of organic and inorganic dielectric materials are known in the art as insulating films in the manufacture of electronic devices, particularly integrated circuits. Suitable inorganic dielectric materials include silicon dioxide and organo polysilicas. Suitable organic dielectric materials include thermosets such as polyimides, polyarylene ethers, polyarylenes, polycyanurates, polybenzazoles, benzocyclobutenes and the like.

Methods of providing porous dielectrics have focused on incorporating particles into the dielectric which are later removed using heat processes. In general, porous dielectric materials are prepared by first incorporating a removable particles into a B-staged dielectric material, disposing the B-staged dielectric material containing the removable particle onto a substrate, curing the B-staged dielectric material and then removing the particle to form pores in the dielectric material. For example, U.S. Pat. No. 5,895,263 (Carter et al.) discloses a process for forming an integrated circuit containing porous organo polysilica dielectric material. U.S. Pat. No. 6,093,636 (Carter et al.) discloses a process for forming an integrated circuit containing porous thermoset dielectric material. Gallagher in U.S. Pat. No 6,596,467B2 also describes the use of pore generating materials in dielectrics. In each of these patents, the amount of pores that can be created is limited due in part to the amount of heat needed to depolymerize the particles while maintaining the strength and integrity of the composition. Because there is a limit as to how much of the dielectric can contain pores, the value of the dielectric can not reach below about 2 without compromising the dielectric layer. Also, in the Carter patents, the process described requires the step of forming the porous dielectric material prior to any subsequent processing steps, while in the Gallagher patent the dielectric is fully or partially covered with metal or other materials hindering the removal of the by-products of the depolymerized particles. There is thus a need for processes for manufacturing electronic devices including porous dielectric materials that have dielectric constants below around 2.0 while maintaining the structure integrity of the material.

SUMMARY OF THE DISCLOSURE

It has been found that processes to provide polyimide aerogels as well as hybrid organic-inorganic aerogels are suitable for the manufacture of low k dielectric materials for use in electronic devices.

In a first embodiment of the current application for patent is disclosed and claimed a method for producing a polyimide based low dielectric material suitable for an electronic device including the steps of disposing on a substrate a pre-sol composition including a polyamic acid pre-sol, a catalyst and a polar, aprotic solvent, curing the pre-sol composition to form a wet-gel matrix material, washing the wet-gel with a solvent to replace the polar, aprotic solvent, and removing the solvent using super critical carbon dioxide to provide an aerogel, wherein the dielectric constant of the polyimide aerogel is between about 1.1 and about 2.0.

In a second embodiment of the current application for patent is disclosed and claimed is the method of the above embodiment further including the step of flash exposing either the wet-gel or the aerogel to one or more polar, protic solvents or other anti-solvent to provide an increased density gradient at the surfaces of the aerogel, this step being applied prior to washing the wet-gel with a solvent to replace the polar, aprotic solvent.

In a third embodiment of the current application for patent is disclosed and claimed is the method of the first embodiment, wherein the step of removing the solvent using super critical carbon dioxide is accompanied by pressure cycling in a drying vessel used in the removal process to provide an increase density gradient at the surfaces of the aerogel.

In a fourth embodiment of the current application for patent is disclosed and claimed are methods of the above embodiments wherein the surfaces of the aerogel are capped with non-porous dielectric materials deposited using at least one of chemical vapor deposition, atomic layer deposition, physical layer deposition, or spin-on materials, wherein the spin-on materials are at least on of glasses, siloxanes, silsesquioxanes, polyimides, poly(aryl esters), polycarbonates, poly(arylene ethers), polyaromaic hydrocarbons, poly(perfluorinated hydrocarbons, polycyanurates, polybenzoxazoles, parylenes, polycycloolefins or benzocyclobutenes, annealing the surfaces of the aerogels by treatment with an annealing plasma, or providing a seed layer for metallization.

In a fifth embodiment of the current application for patent is disclosed and claimed are methods of the above embodiments wherein the substrate comprises predefined patterns into which the pre-sol compositions are applied and includes the step of removing the material which pre-defined the patterns after the aerogel is obtained providing an aerogel pattern.

In a sixth embodiment of the current application for patent is disclosed and claimed are methods of the above embodiments wherein the pre-sol composition is a hybrid pre-sol including at least one tetraalkoxysilane which may optionally be partially hydrolyzed at least one bis-trialkoxysilane diimide, a selected amount of water, and a gelation catalyst, or the hybrid pre-sol may be admixed with the polyamic acid pre-sol.

In a seventh embodiment of the current application for patent is disclosed and claimed are methods of the above embodiments in which the aerogel obtained from each process is patterned using standard lithographic and etching techniques.

BRIEF DESCRIPTION OF THE DRAWINGS

FIG. 2 shows the relationship between aerogel density and dielectric constant.

FIG. 3 shows the relationship between aerogel density and compressive strength comparing polyimide aerogels to silica aerogels.

FIG. 4 shows scanning electron microscope images of a silica aerogel and a polyimide aerogel prepared by the methods of the current disclosure.

DETAILED DESCRIPTION

Figure 1:
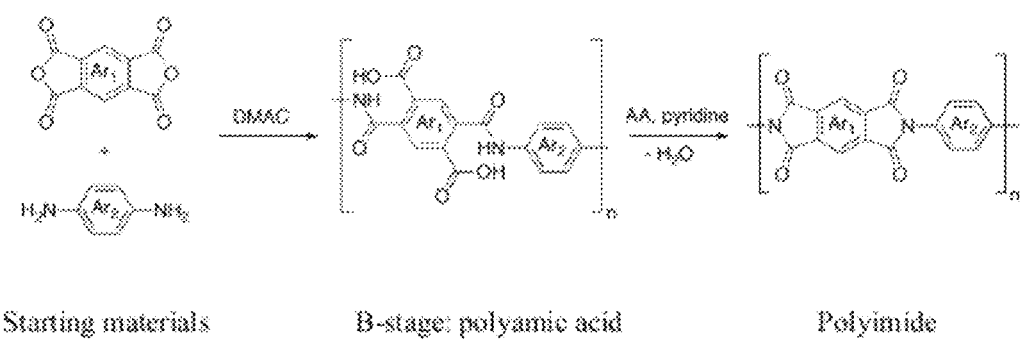
FIG. 1 shows a synthetic scheme for preparing a polyimide.

As used herein, the conjunction "and" is intended to be inclusive and the conjunction "or" is not intended to be exclusive unless otherwise indicated. For example, the phrase "or, alternatively" is intended to be exclusive.

Aerogels are a class of materials formed by removing a mobile interstitial solvent phase from the pores of a gel structure supported by an open-celled polymeric material at a temperature and pressure above the solvent critical point. By keeping the solvent phase above the critical pressure and temperature during the entire solvent extraction process, strong capillary forces generated by liquid evaporation from very small pores that cause shrinkage and pore collapse are not realized. Aerogels typically have low bulk densities, (about 0.15 g/cc or less, preferably about 0.03 to 0.3 g/cc), very high surface areas, (generally from about 400 to 1,000 $m^2/g$ and higher, preferably about 700 to 1000 $m^2/g$), high porosity, (about 95% and greater, preferably greater than about 97%), and relatively large pore volume (more than about 3.8 mL/g, preferably about 3.9 mL/g and higher). The combination of these properties in an amorphous structure gives the lowest thermal conductivity values (9 to 16 mW/m·K at 37° C. and 1 atmosphere of pressure) for any coherent solid material.

One of the most attractive properties of aerogels is their low dielectric constant. Aerogels, for example, have the lowest dielectric constant (k) for a solid, near that of air, 1.0. Additionally, aerogels have exceptionally high dielectric resistivity and strength; they can insulate very high voltages and have low dielectric loss at microwave frequencies. Aerogels have been explored as next generation materials for energy storage, low power consumption, and high-speed electronics. Silica-based aerogels have dominated research for electronic applications. Standard sol-gel chemistry plus a benign drying process yield aerogels with a solid structured network of particles and pores fractions of the wavelength of visible light. The governing features of an aerogel's dielectric properties are primarily the large volume fraction of trapped gas in the pores and the high concentration of adsorbed molecules on the very large internal surface area, most often physisorbed water molecules.

In order to achieve ultra low-k (ULK) dielectrics (k<1.9), materials must be highly porous. Silica aerogels can be made with greater than 90% porosity, yielding dielectric constants less than 1.5. However, the high porosity that gives silica aerogels their remarkable dielectric properties yields a material with very poor mechanical strength, making them too fragile for practical processing technologies in chip manufacturing.

It has surprisingly been found that a process for applying polyimide aerogel precursor compositions in electronic devices leads to polyimide aerogels, when further processed, with dielectric constants below about 2.0 while maintaining high structural integrity, determined by their high compression modulus. The process includes depositing on a substrate a pre-sol composition comprising a polyamic acid pre-sol, a catalyst and a polar, aprotic solvent. The composition may be disposed by any of a number of well known processes such as, for example, spin coating, curtain coating, slot coating, roller coating, inkjet coating, lithographic coating and dip coating.

The composition to be coated is a polyimide pre-sol material. The polyimide pre-sol is a polyamic acid or a partially imidated form thereof, obtained by the admixture of a dianhydride and a diamine, which is also known as a B-stage material, as shown in FIG. 1.

The diamine starting material include, for example, 4,4'-diaminodiphenylether, 3,3'-dimethyl-4,4'-diaminodiphenylether, 3,3'-diethoxy-4,4'-diaminodiphenylether, p-phenylenediamine, 2,6diaminopyridine, 3,6-diaminopyridine, 2,5-diaminopyridine and 3,4-diaminopyridine, but others may also be used. More than one diamine may be used as starting materials in the disclosed process.

The dianhydride starting materials include, for example, 3,3',4,4'-biphenyltetracarboxylic dianhydride, 2,3,3',4'-biphenyltetracarboxylic anhydride, 2,3,3',4'- and 3,3',4,4'-biphenyltetracarboxylic anhydride, 2,3,3',4'- and 3,3',4,4'-biphenyltetracarboxylic anhydride. pyromellitic acid, 3,3',4,4'-benzophenonetetracarboxylic acid, 2,2-bis(3,4-dicarboxyphenyl)propane, bis(3,4-dicarboxyphenyl)sulfone, bis(3,4dicarboxyphenyl)ether, bis(3,4-dicarboxyphenyl)thioether. The starting materials for making B-staged polyamic acid is not limited only to dianhydrides but can include, for example, the free acids, their salts or their esters. More than one dianhydride, or derivative, may be used as starting materials in the disclosed process.

Polar, aprotic solvents used in the preparation of the pre-sol composition, include, but not limited to, N-methyl-2-pyrrolidone (NMP), pyridine, N,N-dimethylacetamide (DMAC),N,N-dimethylformamide, and dimethylsulfoxide A catalyst is admixed with the pre-sol composition in order to complete the imidization process to provide the polymeric polyimide wet gel, wherein the solvent is still present. While heat may be used to obtain the polyimide, the current process provides for the retention of solvent in the gel to maintain pores. It has been found that heat high enough to imidize the polyamic acid will drive off the solvent and cause the pores to collapse. Typical catalysts known in the art to aid in the imidization process include, for example, amines, such as for example, pyridine and dehydrating agents such as, for example, acetic acid. The pre-sol coating is then cured at low temperature, between about room temperature and 60° C., for a period of time, between about 1 to about 24 hours, depending on the nature and amount of the catalyst used, to provide the polyimide wet-gel.

The resulting gel material may be washed in a suitable solvent to replace the reaction solvent present in the wet-gel. Such solvents may be linear monohydric alcohols with 1 or more aliphatic carbon atoms, dihydric alcohols with 2 or more carbon atoms, branched alcohols, cyclic alcohols, alicyclic alcohols, aromatic alcohols, polyhydric alcohols, ethers, ketones, cyclic ethers or their derivative. This process may be followed by removal of the solvent using super critical $CO_2$. Drying of the wet gel can be accomplished using a variety of methods to obtain the desired aerogel porosity and structure. Methods of drying gels to obtain aerogels or xerogels are well known in the art. U.S. Pat. Nos. 5,275,796 and 5,395,805 describe supercritical drying to produce silica aerogels. U.S. Pat. No. 6,670,402 teaches drying via rapid solvent exchange of solvent inside wet gels using supercritical $CO_2$ by injecting supercritical, rather than liquid, $CO_2$ into an extractor that has been pre-heated and pre-pressurized to substantially supercritical conditions or above to produce aerogels. U.S. Pat. No. 5,962,539 describes a process for obtaining an aerogel from a polymeric material that is in the form a sol-gel in an organic solvent, by exchanging the organic solvent for a fluid having a critical temperature below a temperature of polymer decomposition, and supercritically drying the fluid/sol-gel. U.S. Pat. No. 6,315,971 discloses processes for producing gel compositions comprising: drying a wet gel comprising gel solids and a drying agent to remove the drying agent under drying conditions sufficient to minimize shrinkage of the gel during drying.

One example of drying the wet-gel/wet-film of the current disclosure uses supercritical conditions of $CO_2$ including for example, first substantially exchanging the solvent present in the porosity of the gels by liquid $CO_2$ and in the second step heating the autoclave (in which the wet gel or the substrate coated with the wet-gel is placed) beyond the critical temperature of $CO_2$ which is 31.06° C. and increasing the pressure to a pressure greater than about 1070 psig. In an alternative way, the drying of aerogels is carried out directly by heating the autoclave beyond the critical temperature of $CO_2$. The system is kept at these conditions for at least an hour while a continuous flow of $CO_2$ at the above described conditions is maintained to ensure that essentially all the solvent have been removed from the gel. After that, the autoclave is depressurized slowly to atmospheric pressure.

In another example of the drying process the wet-gel is not processed through the solvent washing step but is exposed to the super critical $CO_2$ process containing a small percentage of a solvent, or solvents, that are reasonably miscible with super critical $CO_2$ such as those that can be used in the washing step listed above, in an amount, for example, between 1 and 10% of the $CO_2$. Generally polar protic/aprotic solvents are suitable for this purpose.

In some embodiments of the current disclosure both the washing step and the critical $CO_2$ containing solvent steps are used while in some other embodiments, the washing step can be avoided.

The resulting materials are called aerogels and have densities between 0.05 and 0.40 g/cc. As shown on FIG. 2, the density of the aerogel is in essentially direct proportion to the dielectric constant. The polyimides of the current invention also have high mechanical strength as shown in FIG. 3. For example, the polyimide aerogel with a density of 0.30 g/cc has a dielectric constant of approximately 1.4 with and a compression modulus of approximately 15,000 psi. In certain embodiments of the present invention, polyimide aerogels with varying compression modulus from 5000 psi to 25000 psi are employed. The silica aerogel of similar density and dielectric constant has a compression modulus of only approximately 1000 psi. Thus it can be seen that the process to provide low-k dielectric polyimide aerogels results in materials that can be used in electronic devices as well as in the processes used to make the electronic devices. FIG. 4 shows the surface of a polyimide aerogel prepared by the currently disclosed methods, shown in comparison to a silica aerogel prepared by standard techniques for their preparation.

In many electronic devices dielectrics are used to insulate various signal carrying materials and components. In many of the processes the dielectrics are exposed to various plating processes such as chemical vapor deposition of conductive materials which are later processed into signal carrying lines and interconnections. It may thus be desirable to provide a barrier layer to prevent materials from infiltrating the pores of the dielectric aerogel and thus compromise a portion of its dielectric strength. The current disclosure provides for a number of methods of provide such a barrier. The term "capping" is used herein to describe the process of providing such barrier.

In another embodiment, surface of the polyimide aerogel film facing away from the substrate may be treated to make it denser. Polyimide aerogel thin films are treated with predetermined quantities of one or more suitable solvents in liquid or vapor form to modify the surface sufficient enough to substantially seal the surface pores of the film. The duration, temperature, pressure and direction of such solvent exposure/treatment may be varied to control the amount of surface sealing required to substantially maintain the effective dielectric constant of the whole system. Solvents suitable for the surface densification process are linear monohydric alcohols with 7 or more aliphatic carbon atoms, dihydric alcohols with 7 or more carbon atoms, branched alcohols, cyclic alcohols, alicyclic alcohols, aromatic alcohols and other high-boiling point alcohols as well as polyhydric alcohols, ethers, cyclic ethers or their derivative In another embodiment, surface densification is achieved during super critical $CO_2$ drying. During that process the pressure of the drying vessel is cycled, to induce localized stresses on the pores of a gel, thereby creating a gradient in density across the thickness direction. For example, during the super critical drying described above the pressure can be cycled between 100 psi and 1070 psi a pre-determined number of times. Alternatively, ultrasonic or similar energy sources may be used in the drying process to achieve a local pressure cycling at the surface of the polyimide aerogel thin films.

Other methods are disclosed to "cap" the dielectric polyimide aerogel. The term "cap" used herein refers to a barrier layer which retards materials from subsequent processes from seeping into the porous dielectric to the extent that the dielectric constant is retained to about 75% or more of the original dielectric constant. These include traditional capping processes such as chemical vapor deposition (CVD), atomic layer deposition (ALD), physical vapor deposition and spin-on organics or inorganics. The spin-on materials are glasses, siloxanes, silsesquioxanes, polyimides, poly(aryl esters), polycarbonates, poly(arylene ethers), polyimides, polyaromatic hydrocarbons, poly(perfluorinated hydrocarbons, polybenzoxazoles, parylenes, polycycloolefins, benzocyclobutenes, or combinations thereof. The capping materials applied by the vapor deposition and atomic layer deposition include metal oxides such as, for example $Al_2O_3$, $TiO_2$, $SnO_2$, ZnO, $HfO_2$ as well as other oxides, metal nitrides, such as InN, TaN, WN, NbN or their carbides, metal sulfides, such as for example, ZnS or metals, such as Ru, Ir, or Pt. These examples are non-restrictive as other material known in the art can be applied in the similar manner as described above.

Also disclosed are methods wherein the surfaces of the dielectric polyimide aerogel may also be sealed by sintering processes such as, for example, treatment with plasma to for a shell-like barrier. The surface of the aerogel film away from the substrate is treated with laser radiation to seal the surface, such as, for example, an infrared laser that melts the surface of the film causing it to self-seal the pores on the surface of the film.

A further method for capping is disclosed wherein a seed layer is placed on the surfaces of the polyimide aerogel film away from the substrate. This seed layer provides metallization or nucleation sites on the surface. The polyimide aerogel film is then placed in a metallization bath and a metal coating over the pores is achieved, thus providing a barrier.

The disclosed capping methods may be applied to the dielectric polyimide aerogel after drying with super critical $CO_2$ or after the surface has been densified, as disclosed above.

The polyimide aerogel materials of the several embodiments of the present invention are in the form of films with thicknesses ranging from 10 nm to 100,000 nm. Thickness may be controlled by the amount of pre-sol composition dispensed on to the substrate.

The pre-sol composition may be applied to a surface such as a silicon wafer which may or may not contain other layers, a dielectric surface, a glass surface and the like. The pre-sol can then be processed to form the dielectric polyimide aerogel. The aerogel may then be patterned using standard patterning techniques such as, for example, patterning a photoresist followed by removal of the polyimide aerogel. Other techniques include applying an etch stop, followed by photoresist patterning, etching the polyimide and optionally removing the etch stop. The aerogel may be capped or densified at any of the stages of the described processes.

The pre-sol composition may further be applied to substrates such as structures, or patterned surfaces. For example, the pre-sol composition is applied into spaces, trenches, holes and the like, provided by a photoresist pattern. The pre-sol is gelled and the photoresist is removed to leave behind a pattern of polyimide aerogel structures. These structures can be subsequently capped as described above. Thus obtained article may be exposed to all typical processes in the manufacture of electronic devices or semiconductor fabrication.

The pre-sol composition may be composed of a hybrid pre-sol, containing at least one tetraalkoxysilane which may optionally be partially hydrolyzed, at least one bis-trialkoxysilane diimide, a selected amount of water, and a gelation catalyst, in which case the provided aerogel is a dielectric hybrid aerogel containing siloxane moieties with imide cross-links. The composition could be a blend of both the hybrid pre-sol and the polyamic acid pre-sol, in which case the dielectric aerogel is a combination of polyimide and hybrid aerogel structure. The hybrid aerogel compositions useful in this embodiment include the ones disclosed in U.S. patent application Ser. No. 13/299,677 filed on Nov. 18, 2011 which is incorporated by reference herein.

Although the present invention has been shown and described with reference to particular examples, various changes and modifications which are obvious to persons skilled in the art to which the invention pertains are deemed to lie within the scope and contemplation of the subject matter set forth in the appended claims.

Figure 5A:
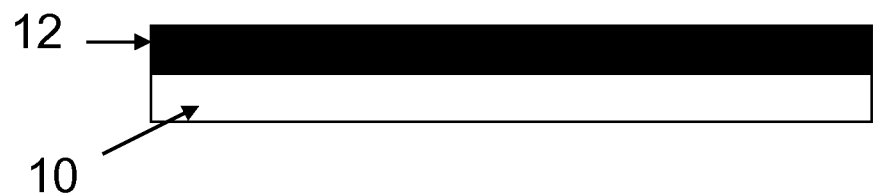
FIG. 5a-5f are a cross section of an electronic device showing the dielectric aerogels of the current disclosure at various stages of manufacturing.
Figure 5B:
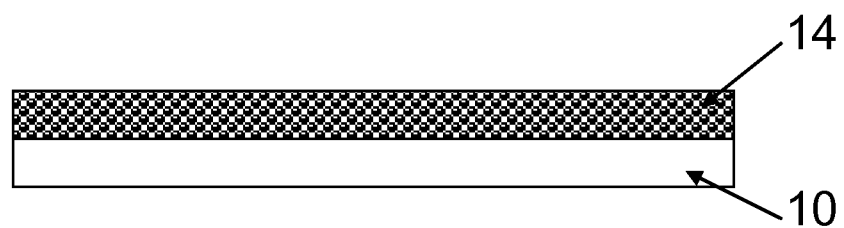
Figure 5C:
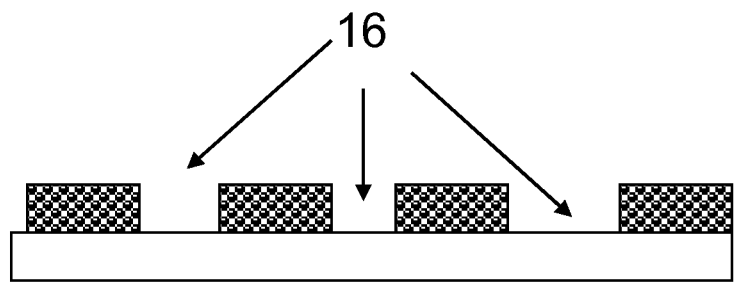
Figure 5D:
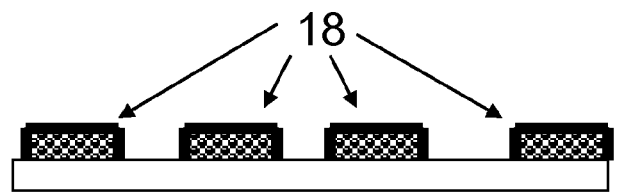
Figure 5E:
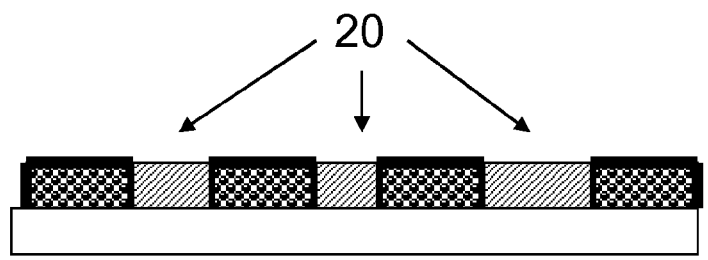
Figure 5F:
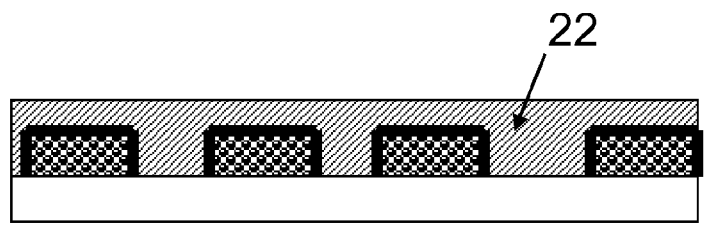
Figure 6:
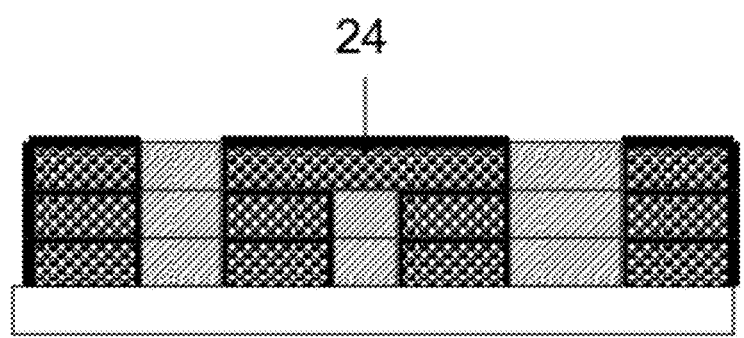
FIG. 6 is a cross section of an electronic device showing multiple layers of the dielectic aerogels of the current disclosure.

Referring to FIG. 5, a substrate 10 is coated with a pre-sol composition 12 in FIG. 5a. The pre-sol composition is processed to form polyimide aerogel film 14 on substrate 10 in FIG. 5b. Pattern 16 in FIG. 5c are provided using lithographic techniques involving photoresists followed by etching of the exposed polyimide aerogel and removal of the photoresist. The aerogels are shown "capped" 18 in FIG. 5d followed by the incorporation of signal line 20 in FIG. 5e. Often the metallization process results in completely plating the whole surface as shown in FIG. 5f. In order to remove the excess copper a process called chemical mechanical polishing is used. This requires that the materials subjected to this process maintain structure stability in order to withstand the polishing process. FIG. 6 shows a series of stacks using the methods of the current disclosure including the versatility of burying a signal line 22.

What is claimed is:

1. A method for producing a low-k dielectric component suitable for an electronic device comprising the steps of:
   a) disposing on to a substrate a layer of pre-sol composition comprising a polyamic acid pre-sol, a catalyst and a polar, aprotic solvent,
   b) curing the pre-sol composition to form a wet-gel material,
   c) removing the solvent using supercritical fluid to provide a polyimide aerogel film, and
   d) capping a surface of the polyimide aerogel film away from the substrate with at least one non-porous, low-k dieletric material.

2. The method of claim 1, wherein the step of removing the solvent using super critical fluid is accompanied by pressure cycling to provide an increased density at the surface of the aerogel film away from the substrate.

3. The method of claim 1, wherein the pre-sol composition comprises a hybrid pre-sol comprising:
   a) at least one tetra-, tri-, di- and/or mono-alkoxysilane which may optionally be partially hydrolyzed,
   b) at least one bis- bi-, or trialkoxysilane diimide,
   c) a selected amount of water, and
   d) a gelation catalyst.

4. The method of claim 1, wherein the method further comprises at least one step which produces an aerogel with a pattern.

5. The method of claim 4, wherein at least one step which produces an aerogel with a pattern comprises:
   a) providing a predefined pattern on the substrate with a patterning material,
   b) applying the pre-sol compositions on to the predefined patterns, and
   b) optionally removing the patterning material after the aerogel film is obtained to provide an aerogel pattern.

6. The method of claim 1, wherein the step of capping the surface of the aerogel film comprises capping a portion of the surface of the aerogel film away from the substrate, or capping the entirety of the surface of the aerogel film away from the substrate.

7. The method of claim 1, wherein the polyimide aerogel film has a density between about 0.05 and about 0.40 g/cc.

8. The method of claim 1, wherein the polyimide aerogel film has a dielectric constant between about 1.1 and 2.0.

9. The method of claim 1, wherein the at least one non-porous, low-k dieletric material comprises glasses, siloxanes, silsesquioxanes, polyimides, poly(aryl esters), polycarbonates, poly(arylene ethers), polyimides, polyaromatic hydrocarbons, poly(perfluorinated hydrocarbons, polybenzoxazoles, parylenes, polycycloolefins, benzocyclobutenes, or combinations thereof.

10. The method of claim 1, wherein the step of capping a surface of the polyimide aerogel film comprises dispersing the non-porous, low-k dieletric material onto at least a portion of the polyimide aerogel film surface by chemical vapor deposition, atomic layer deposition, physical vapor deposition, spin-on deposition, or combinations thereof.

11. A low-k dielectric component suitable for an electronic device produced by the method of claim 1.

12. The low-k dielectric component of claim 1, comprising: a substrate layer; a polyimide aerogel film coating at least a portion of the substrate; and a barrier layer coating at least a portion of the polyimide aerogel film away from the substrate; wherein the barrier layer comprises at least one non-porous, low-k dieletric material.

13. The low-k dielectric component of claim 12, wherein the polyimide aerogel film has a density between about 0.05 and about 0.40 g/cc.

14. The low-k dielectric component of claim 12, wherein the polyimide aerogel film has a dielectric constant between about 1.1 and 2.0.

15. The low-k dielectric component of claim 12, wherein the polyimide aerogel film is formed from a pre-sol composition comprising: a polyamic acid pre-sol, a catalyst and a polar, aprotic solvent.

16. The low-k dielectric component of claim 15, wherein the pre-sol composition comprises a hybrid pre-sol composition, comprising:

a) at least one tetra-, tri-, di- and/or mono- alkoxysilane which may optionally be partially hydrolyzed,
b) at least one bis- bi-, or trialkoxysilane diimide,
c) a selected amount of water, and
d) a gelation catalyst.

17. The low-k dielectric component of claim 12, wherein the at least one non-porous, low-k dieletric material comprises glasses, siloxanes, silsesquioxanes, polyimides, poly(aryl esters), polycarbonates, poly(arylene ethers), polyimides, polyaromatic hydrocarbons, poly(perfluorinated hydrocarbons, polybenzoxazoles, parylenes, polycycloolefins, benzocyclobutenes, or combinations thereof.

18. The low-k dielectric component of claim 12, wherein the barrier layer is coated onto the polyimide aerogel film by chemical vapor deposition, atomic layer deposition, physical vapor deposition, spin-on deposition, or combinations thereof.

* * * * *